United States Patent [19]

Masson et al.

[11] Patent Number: 5,303,164

[45] Date of Patent: Apr. 12, 1994

[54] INSULATION MONITOR WITH IMPROVED PRECISION

[75] Inventors: Erik Masson, Barraux; Serge Lassagne, Meylan; Philippe Magnard, Bourgoin Jallieu, all of France

[73] Assignee: Merlin Gerin, France

[21] Appl. No.: 789,880

[22] Filed: Nov. 12, 1991

[30] Foreign Application Priority Data

Nov. 28, 1990 [FR] France ............................ 9014990

[51] Int. Cl.$^5$ .............................................. G01B 7/00
[52] U.S. Cl. ............................ 364/551.01; 364/492; 364/482; 361/42; 361/47; 340/647; 324/541; 324/557
[58] Field of Search ............... 361/42, 47; 364/551.01, 364/492, 482; 324/541, 544, 551, 552, 557, 705, 713; 340/647, 661

[56] References Cited

U.S. PATENT DOCUMENTS

| | | | |
|---|---|---|---|
| 4,214,311 | 7/1980 | Nakashima et al. | 324/541 |
| 4,528,497 | 7/1985 | Arato . | |
| 4,736,157 | 4/1988 | Betker et al. | 340/661 |
| 4,737,775 | 4/1988 | Tokuda et al. | 340/647 |
| 4,757,263 | 7/1988 | Cummings, III et al. | 324/552 |
| 4,969,062 | 11/1990 | Barylak et al. | 361/42 |
| 4,980,645 | 12/1990 | Soma et al. | 324/541 |
| 4,989,154 | 1/1991 | Yamashita et al. | 364/482 |
| 5,117,191 | 5/1992 | Saigo et al. | 324/544 |

FOREIGN PATENT DOCUMENTS 2181561  4/1987  United Kingdom .

Primary Examiner—Kevin J. Teska
Assistant Examiner—Hal D. Wachsman

[57] ABSTRACT

The processing circuit of the insulation monitor comprises a microprocessor receiving on a first input a signal representative of the DC component, or the component of preset frequency different from the frequency of the mains system to be monitored, of the voltage applied to the insulation monitor terminals. The microprocessor receives on a second input a signal obtained by making the difference between a measured voltage representative of said voltage component and a preset threshold value and by multiplying this difference by a multiplication coefficient. When the measured voltage is greater than the threshold value, the microprocessor uses the signal applied to the second input so as to improve the precision in the higher voltage range.

6 Claims, 2 Drawing Sheets

INSULATION MONITOR WITH IMPROVED PRECISION

BACKGROUND OF THE INVENTION

The invention relates to a continuous insulation monitor comprising an input voltage generator, either DC or of a preset frequency different from the frequency of the mains system to be monitored, a processing circuit comprising a measuring circuit of the DC or preset frequency component of the voltage applied to its terminals, a microprocessor comprising a first input connected to the output of the measuring circuit and comprising means for converting the output signal of the measuring circuit into a numerical value, for computing from the numerical value a value representative of the insulation resistance of the mains system to be monitored, for comparing the value representative of the insulation resistance with at least one preset threshold and for supplying an alarm signal on an output when this value is lower than the threshold, and an alarm and signalling circuit connected to the microprocessor output.

In an insulation monitor of this kind, to obtain a good precision for all insulation resistance values, an analog-to-digital converter has to be used providing a greater precision than the required precision, for example a 12-bit converter.

SUMMARY OF THE INVENTION

The object of the invention is to achieve an insulation monitor enabling the required precision to be obtained using a standard precision analog-to-digital converter, for example an 8-bit converter.

According to the invention, this object is achieved by the fact that it comprises, between the measuring circuit output and a second microprocessor input, a magnifying circuit comprising means for making the difference between the measuring circuit output signal and a preset threshold value and means for multiplying said difference by a preset multiplication coefficient.

The precision can thus be improved for higher voltage values corresponding to low insulation resistance values.

According to a development of the invention, the magnifying circuit comprises an operational amplifier whose non-inverting input is connected by a first resistance to the measuring circuit output and by a second resistance to ground, its inverting input being connected by a third resistance to a preset reference voltage, and by a fourth resistance to the output of the operational amplifier, the first resistance having the same value as the third, and the second resistance having the same value as the fourth.

According to a development of the invention, the microprocessor comprises means for determining whether the signal applied to its second input is nil, and if it is nil, for converting the signal applied to its first input. The microprocessor also comprises means for, if the signal applied to its second input is not nil, dividing it by the multiplication coefficient, after conversion, and adding a numerical value corresponding to the threshold value to the converted value, so as to obtain the numerical value representative of the measuring circuit output signal.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

In conventional manner, an insulation monitor comprises a generator (not shown) of DC voltage or voltage with a preset frequency different from the mains system frequency, applying a voltage of preset value between the earth and the mains system to be monitored. A processing circuit measures the voltage applied to the terminals of the monitor, extracts the DC component or the component of preset frequency from it by filtering, computes from this component a value representative of the mains system insulation resistance and compares this value with preset thresholds so as to actuate an alarm when the insulation resistance is lower than one of these thresholds. The processing circuit according to FIG. 1 comprises a micro-processor 1 designed to compute the value representative of the insulation resistance from the measured voltage V3, compare this value with thresholds and actuate an alarm and signalling circuit 2 if required.

The measuring circuit to which a signal V1 is applied comprises a shaping circuit 3 supplying on output a DC voltage signal V2, obtained by filtering and shaping of V1 and able to vary between 0 and a supply voltage Va, preferably between 0 and 5V. The signal V2 is applied to a first input P1 of the microprocessor, preferably via an impedance matching circuit. In the FIGURE this circuit is formed by an operational amplifier 4, whose non-inverting input is connected to the output of the shaping circuit 3 and whose inverting input is connected to the output. The output signal V3 of the operational amplifier 4 is applied, via a resistance R1, to the input P1 of the microprocessor which computes the corresponding insulation resistance value.

Figure 2:
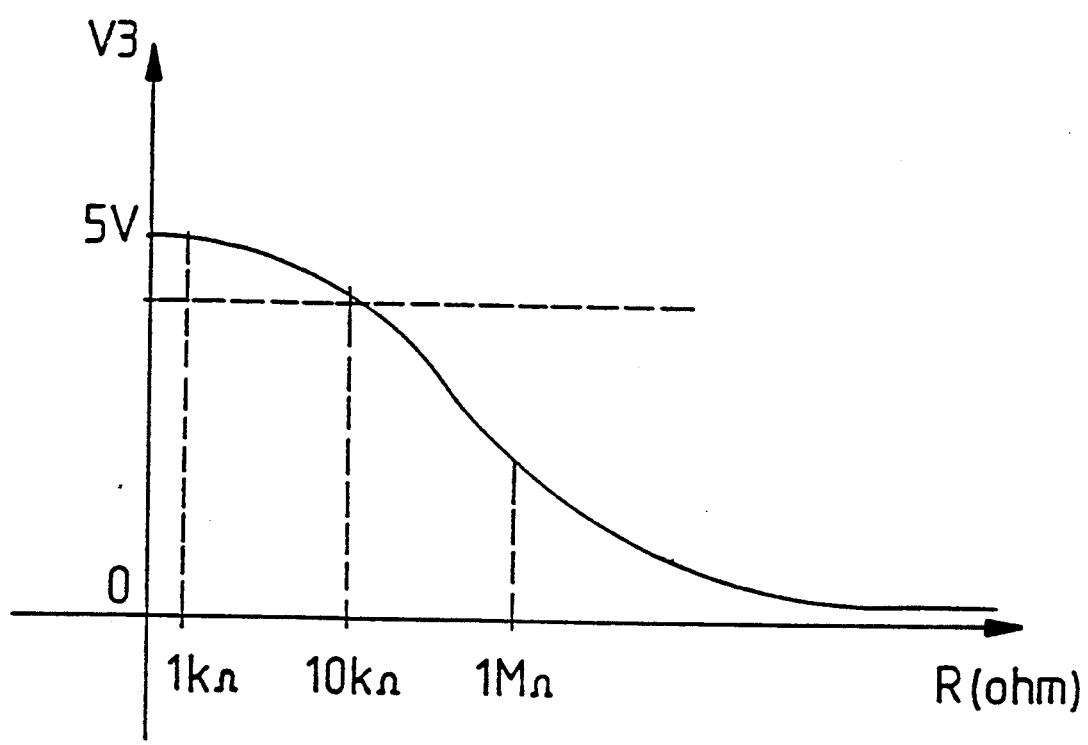
FIG. 2 represents, in logarithmic coordinates for the resistance, the curve of the voltage in terms of the insulation resistance value.

FIG. 2 illustrates the relationship between the voltage V3 and the mains system insulation resistance R, the resistance being represented in logarithmic coordinates. For the same percentage variation of the insulation resistance value, the variation of the measured voltage is small for low resistance values and large for high resistance values. To give an example, for a 10% variation of the insulation resistance value, the voltage variation is 112 mV for a 100 Kohm resistance and only 33 mV for a 10 Kohm resistance. With the processing circuit described above, the precision is insufficient for low insulation resistance values unless a very accurate, and therefore costly, analog-to-digital converter is used.

Figure 1:
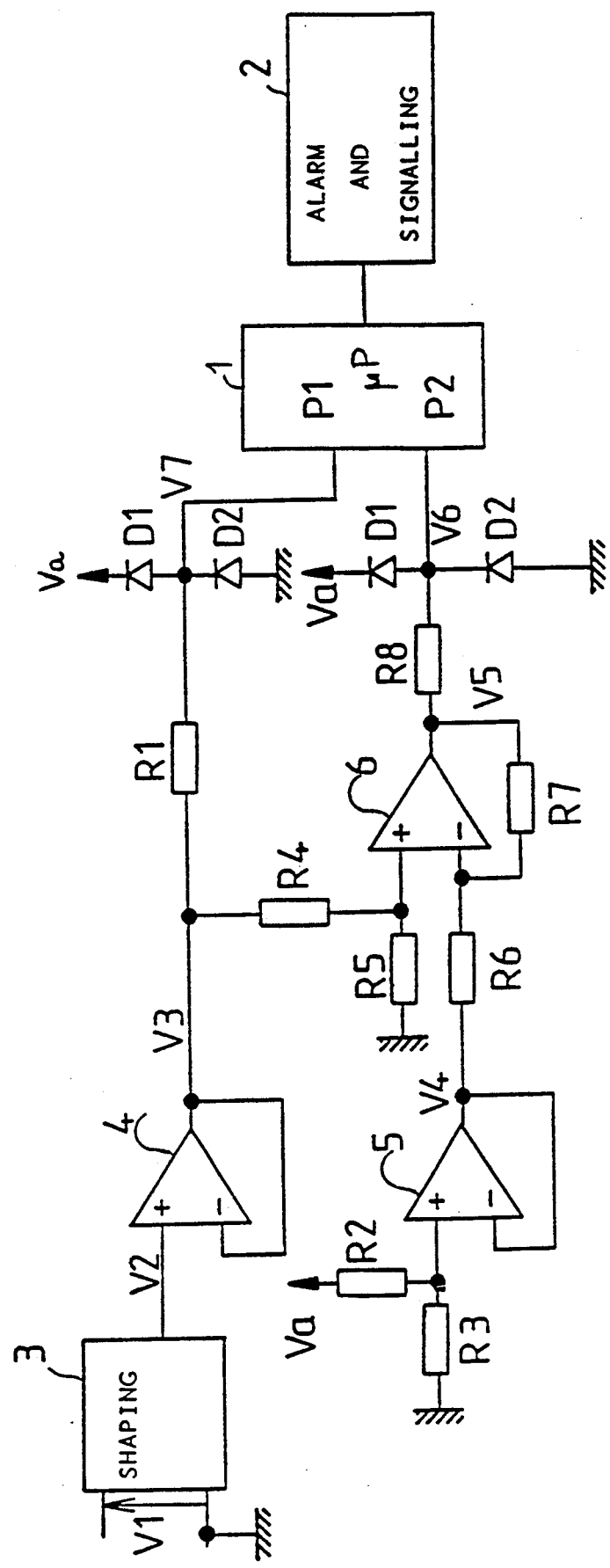
FIG. 1 illustrates a particular embodiment of the signal processing circuit of a continuous insulation monitor according to the invention.

The processing circuit according to FIG. 1 enables this precision to be increased for low insulation resistance values. This circuit supplies a reference voltage V4. In FIG. 1, this voltage is obtained by means of a resistive voltage divider formed by two resistances R2 and R3 serially connected between the supply voltage Va (for example 5V) and ground. The common point of the resistances R2 and R3 is connected to the non-inverting input of an operational amplifier 5 acting as impedance matching amplifier. Its inverting input is connected to its output on which the reference voltage V4 is present. The output signal V3 of the measuring circuit, present at the output of the operational amplifier 4, is applied via a resistance R4 to the non-inverting input of an operational amplifier 6, itself grounded by a resistance R5. The output voltage V4 of the operational amplifier 5 is applied to the inverting input of the operational amplifier 6 via a resistance R6. Its inverting input is also connected to the output of the amplifier 6 by a resistance R7. The respective values of the resistances are chosen in such a way that: R4=R6 and R5=R7. The operational amplifier 6 operates as a non-inverting summing amplifier and its output signal V5 is then given by:

$$V5 = (V3 - V4) R7 / R6$$

As an example, if Va=5V, V4 can be chosen equal to 4.5V and the relationship R7/R6=8. We then have: V5=8 (V3−4.5V). If we consider FIG. 2, the origin of the voltage range greater than 4.5V is therefore reduced to zero and this range becomes eight times larger. The extent of the range involved can be adjusted to suit requirements, by simply modifying the threshold value V4. The multiplication coefficient R7/R6 is also adjusted according to the precision required.

The signal V5 is applied to a second input P2 of the micro-processor via a resistance R8. The voltage signal V6 applied to the input P2 is limited to values acceptable by the micro-processor by means of two diodes D1 and D2 respectively connected between P2 and the supply voltage Va, and between P2 and ground. Thus, when V4 is lower than V3, the voltage V5 is negative, the diode D2 is then on and the voltage V6 is limited to about −0.3V, i.e. a signal considered as nil by the micro-processor. So long as V5 is comprised between 0 and the supply voltage, the diodes D1 and D2 are off and the voltage V6 is equal to V5. If V5 exceeds the supply voltage Va, the diode D1 is on and limits the voltage V6 to a voltage close to Va. Protective diodes D1 and D2 are likewise connected to the micro-processor input P1.

The microprocessor 1 therefore receives simultaneously on its input P1 a signal V7 representative of the measured voltage V3, and on its input P2 a signal V6 which is nil if the measured voltage is lower than a certain value (V3 is lower than or equal to V4) and which is representative of the amplified difference between the measured voltage and said threshold value if the measured voltage is greater than this threshold value.

The microprocessor, in which an analog-to-digital converter of standard type (8-bit) is incorporated, first of all reads the value of the signal V6. If this signal is nil, it reads the value of the signal V7 and performs processing on the basis of this signal. If, on the other hand, the signal V6 is not nil, it is this one that is used. As the same analog-to-digital converter is used for conversion of V7 and V6, the precision of V6 is multiplied by the multiplication coefficient R7/R6, for example by 8 in the preferred embodiment described above. When the signal V6 is not nil, after conversion, it is divided by the multiplication coefficient R7/R6 and the microprocessor adds to the divided value a numerical value corresponding to the threshold value V4, 4.5V in the example considered, so as to obtain a precise numerical value representative of V3. This value is then processed by the microprocessor in the same way as the signal V7 after analog-to-digital conversion.

The invention is not limited to the embodiment particularly represented in the FIGURES. In particular, it is not limited to the case where the insulation monitor inputs a DC voltage to the mains system and measures the DC component of the voltage applied to its terminals. It is applied in the same way to an insulation monitor which inputs to the mains system a sinusoidal, square, or pseudo-square signal of preset frequency, different from the mains system frequency. In this case, the measured voltage is obtained from the voltage at the terminals of the insulation monitor by filtering of the mains system frequency.

What is claimed is:

1. A continuous insulation monitor for monitoring an electrical mains system, said continuous insulation monitor comprising: an input voltage generator for generating an input signal, a processing circuit comprising a measuring circuit having an input coupled to the output of the input voltage generator, a microprocessor comprising a first input connected to the output of the measuring circuit, wherein the microprocessor converts the output signal of the measuring circuit into a numerical value, computes from the numerical value a value representative of the insulation resistance of the mains system to be monitored, compares the value representative of the insulation resistance with at least one present threshold and supplies an alarm signal on an output when the value is lower than the threshold, an alarm and signalling circuit connected to the microprocessor output, and a magnifying circuit, coupled between the output of the measuring circuit and a second input of the microprocessor, comprising means for determining the difference between the measuring circuit output signal and a present threshold value and means for multiplying said difference by a preset multiplication coefficient and supplying the result to the second input of the microprocessor.

2. The monitor according to claim 1, wherein the magnifying circuit comprises an operational amplifier whose non-inverting input is connected by a first resistance to the measuring circuit output and by a second resistance to ground, its inverting input being connected by a third resistance to a preset reference voltage, and by a fourth resistance to the output of the operational amplifier, the first resistance having the same value as the third, and the second resistance having the same value as the fourth.

3. The monitor according to claim 2, wherein each microprocessor input is connected to a supply voltage by a first protective diode and to ground by a second protective diode.

4. The monitor according to claim 1, wherein the microprocessor comprises means for determining whether the signal applied to the second input of the microprocessor is nil, and if said signal is nil, for converting the signal applied to the first input of the microprocessor into a numerical value.

5. The monitor according to claim 4, wherein the microprocessor comprises means for, if the signal applied to the second input of the microprocessor is not nil, converting said signal to a converted numerical value, by dividing the converted numerical value by the multiplication coefficient, and adding to the converted numerical value a numerical value corresponding to the threshold value, so as to obtain the numerical value representative of the measuring circuit output signal.

6. The monitor according to claim 1, wherein the input signal comprises a DC signal or an AC signal having a frequency different from the frequency of the mains system to be monitored.

* * * * *